United States Patent [19]

Vorbach et al.

[11] 4,044,453
[45] Aug. 30, 1977

[54] METHOD FOR THE PRODUCTION OF A DIODE MATRIX FOR CHARACTER GENERATORS

[75] Inventors: Guenther Vorbach, Schwindegg; Siegfried Kuballa, Puchheim, both of Germany

[73] Assignee: Siemens Aktiengesellschaft, Berlin & Munich, Germany

[21] Appl. No.: 610,926

[22] Filed: Sept. 8, 1975

[30] Foreign Application Priority Data

Sept. 11, 1974 Germany .............................. 2443491

[51] Int. Cl.$^2$ ............................................. B01J 17/00
[52] U.S. Cl. ......................................... 29/574; 29/577; 29/591; 29/626
[58] Field of Search ..................... 29/577, 577 IC, 583, 29/626, 574, 591

[56] References Cited

U.S. PATENT DOCUMENTS

| | | | |
|---|---|---|---|
| 3,128,332 | 4/1964 | Burkig | 29/577 IC |
| 3,171,204 | 3/1965 | Balducci | 29/626 |
| 3,290,557 | 12/1968 | Ayer | 29/577 IC |
| 3,384,879 | 5/1968 | Stahl | 29/577 IC |

*Primary Examiner*—W. Tupman
*Attorney, Agent, or Firm*—Hill, Gross, Simpson, Van Santen, Steadman, Chiara & Simpson

[57] ABSTRACT

A method of producing a diode matrix disposed on a plug-in circuit board, for use as a character generator, in particular for a code generator of electronic teleprinters, or for a circuit board with optionally differing line configurations, in which the entire diode matrix is fabricated, irrespective of the number of actual diodes to be ultimately employed, whereby the maximum design number of diodes to be carried by the board are mounted and operatively connected to produce a complete operative diode matrix, disposing each diode in such relation with respect to the board that at least one of the electrical leads of such diode is sufficiently exposed for possible severance thereat, and thereafter programming the matrix to the desired characters to be transmitted by rendering unrequired diodes inoperative, severing at least one lead thereof or by removal of the particular diode.

In one embodiment of the invention the diodes are positioned in a generally parallel relation with respect to the circuit board upon which they are to be mounted, whereby both of the electrical leads to the diode may, if desired, be severed to permit the removal of the diode from the matrix. In another embodiment the respective diodes are disposed at right angles to the general plane of the circuit board whereby the outermost lead of the diode is readily available for severance.

4 Claims, 4 Drawing Figures

METHOD FOR THE PRODUCTION OF A DIODE MATRIX FOR CHARACTER GENERATORS

BACKGROUND OF THE INVENTION

The invention relates to a method of producing a diode matrix, constructed in the form of a plug-in circuit board, for character generators, particularly for the code generator of electronic teleprinters or for a circuit board with optionally differing conductor configurations.

Character generators are employed in connection with the transmission of individual or groups of teleprinter characters in the teleprinter circuit technique and the like. For example, consecutive number generators are known which automatically transmit specific teleprinter characters before every message. Mechanical character generators were initially employed, which have long since been superseded by electronic character generators. Such general type of electronic character generator is illustrated in the book "Fernschreib-Vermittlungs-technik" by Rossberg/Korta, 1959, page 228. A diode matrix is provided in connection with the production of the characters, at the inputs of which are supplied the output signals of a ring counter which possesses as many stages as the number of elements possessed by the characters involved. Identical elements of all the characters appear simultaneously at the outputs of the diode matrix. While the name or code generators of teleprinters, on the other hand, have heretofore been a mechanical design, future electronic teleprinters will likewise require electronic code generators, as mechanical code generators occupy too much space, require too much power and generate too much noise, as well as presenting difficulties in connection with interference suppression. Furthermore, in such case the cost of mechanical code generators becomes excessive.

A diode matrix can be utilized to construct not only character generators, such as above referred to, but also code generators or so-called variant generators which are required, for example, for setting the keyboard type (full or narrow), the line spacing or the operational speed, and for signalling the end of the paper, or automatic "carriage return." In this application such a diode matrix can be interrogated by means of devices which are available in an electronic teleprinter. The diode matrix of a code generator must comply with various requirements. First, 20 freely selectable characters must be capable of production. Second, such characters must be capable of basic transmission in the five-element code or in the eight-element code. In addition, the diode matrix must be readily exchangeable when substitute machines are to be employed, must be able to be set at the characters to be transmitted by the customer service, or by the administrative service, without the use of special tools, and also must be capable of correction of the setting in the event of errors during the programming of the matrix.

It is also possible to construct a diode matrix utilizing the known screw diodes which are screwed vertically into a circuit board of appropriate construction at desired conductor intersection points. However, in this case only the number of diodes absolutely necessary for the desired functions are employed. It will be appreciated that both such diodes and the requisite construction required therefor are relatively expensive with the insertion of the diodes requiring a special tool and the time outlay for effecting programming being relatively great.

It is also possible to construct a matrix by the utilization of a crossbar distributor and commercially available diode plugs. In this case, while the time outlay for the programming is considerably less, a special tool is again required for handling the very small diode plugs.

BRIEF SUMMARY OF THE INVENTION

The invention therefore has as its objective to provide a method in connection with the production and utilization of a diode matrix which avoids the disadvantages of the known methods, heretofore referred to.

This objective is achieved in accordance with the invention by initially equipping the circuit board with the maximum design number of diodes, which may be of common relatively inexpensive construction having wire type electrical connecting leads, which diodes are initially mounted on the circuit board and connected, for example by soldering, to the input and output conductor lines, which may be disposed on one or both sides of the carrier board, to form a complete operative matrix. The matrix so formed may then be readily programmed for the characters which are to be transmitted, by the simple expedient of either cutting out or severing a connection of the diodes not required for the desired transmission.

This method facilitates a very simple programming of the diode matrix without requiring special tools, auxiliary equipment or special knowledge. The correction of programming errors is relatively simple one and the setting of the matrix is readily detectable, thereby facilitating reliable checking. Production costs are low in comparison to those of the known method, in particular when the circuit design enables a circuit board having conductors on only one side to be employed as the carrier.

Where the amount of available space is particularly small, it is expedient to use circuit boards which are provided with conductors on both sides thereof.

In an advantageous exemplary embodiment of the invention, the diodes are arranged in parallel relation with respect to the plane of the circuit board thus enabling a simple, inexpensive and automatic production of the circuit boards and diodes.

In fabricating the matrix, it is also possible to arrange the diodes at right angles to the circuit board. When this arrangement is employed, the diodes would normally be disposed in a common synthetic i.e. plastic component or the like, which in turn would be mounted on a circuit board with the arrangement, and offering the advantage of very small structural size.

BRIEF DESCRIPTION OF THE DRAWINGS

In the drawings wherein like reference characters indicate like or corresponding parts.

DETAILED DESCRIPTION OF THE INVENTION

Figure 1:
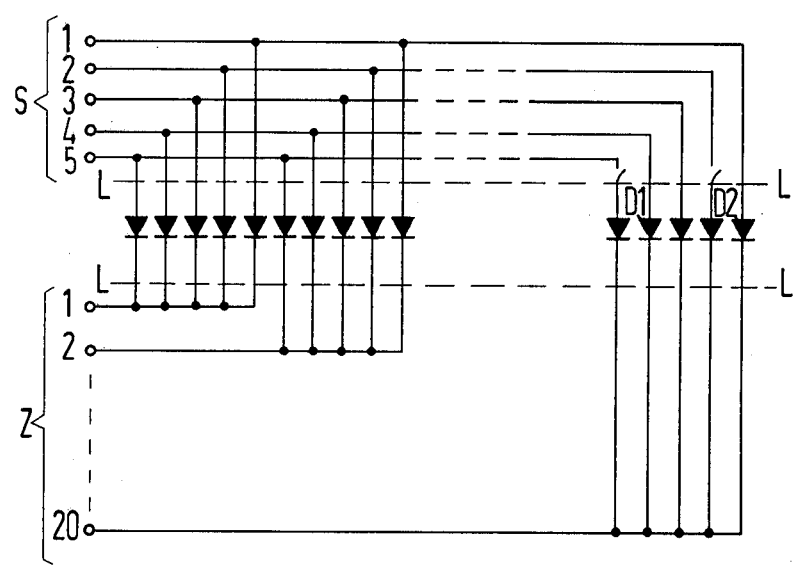
FIG. 1 is a circuit diagram of a diode matrix.

Referring to FIG. 1, in the circuit therein illustrated, it is assumed that up to 20 various characters are to be capable of production with the aid of the diode matrix, and it is also assumed that each character possesses 5 elements. It will be appreciated, however, that it is correspondingly possible to develop the circuit by appropriate extensions for characters of, for example, 8 elements.

The inputs 1 to 5 of the five signal lines S are connected in known manner, with a ring counter which applies positive potential to each of the 5 inputs in a cyclic sequence. Prior to the programming of the matrix, each of these five signal lines is connected over a diode to the 20 interrogation lines Z1 to Z20. The broken lines L in the drawing indicate where the diodes may be disconnected for the purpose of programming the matrix. It will be assumed that the character designated by the number 20 will be involved, and identified by the potential sequence + − + − +. To effect the desired programming the diodes D1 and D2 which connect the signal lines S2 and S4 to the interrogation line Z20 are rendered inoperative, i.e. for example removed from the circuit. Accordingly, the desired positive potential will appear on the interrogation line Z20 only when a positive potential occurs on the signal lines S1, S3 and S5. Groups of diodes assigned to other characters will be programmed in the same manner.

Figure 2A:
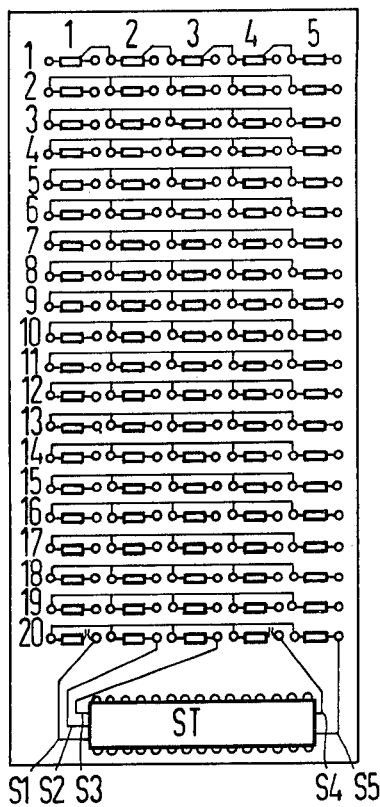
FIG. 2 illustrates details of construction of a plug-in circuit board, FIG. 2a illustrating one side thereof, FIG. 2b illustrating a side elevational view thereof, and FIG. 2c illustrating the opposite side of the board.
Figure 2B:
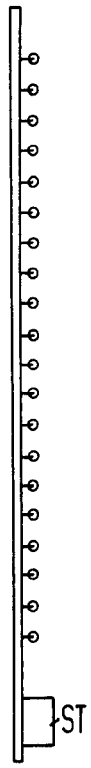
Figure 2C:
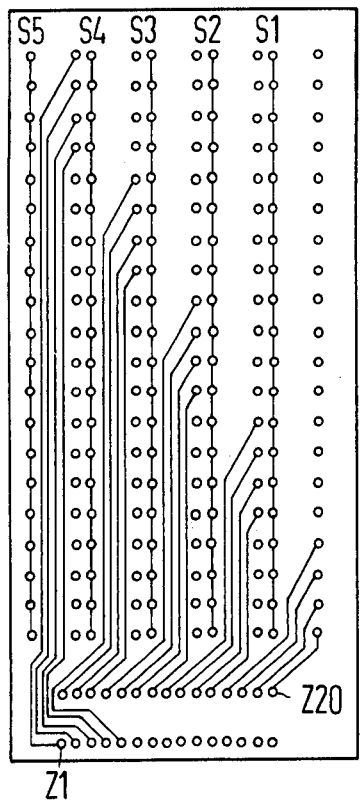

FIG. 2 illustrates the construction of the plug-in circuit board which, in this case, is provided with conductors on both sides of the board and is provided with 10 × 20 = 200 apertures or bores for the diode connections in which the diodes are to be disposed parallel to the circuit board. In addition, 30 more bores are provided for the 30-pole plug ST. As illustrated in FIG. 2a, which illustrates the upper side of the board for each character, the diodes (5 in this case) are arranged adjacent one another in a row Z with the sequence of the diodes being numbered from 1 to 5 in correspondence to the sequence of the elements in the character. In accordance with the number of the characters involved, 20 rows, each with five diodes are arranged one beneath the other with such rows being identified by the digits 1-20, in accordance with the number of characters involved. The diodes located in a column SP $k$ ($k = 1, 2, \ldots, 5$) operatively switch through the positive potential to the interrogation line upon the $k$-th element of the character.

When the circuit board is constructed as an automated operation, the lead wires of a diode are inserted into the desired two adjacent bores and its terminal wires ultimately soldered in place. The cathodes of all the diodes in a row are connected to one another over a conductor path with the signal lines S1, S2, S3, S4 and S5 being connected to the anodes of the diodes in a row, for example row 20. The anodes of all the diodes located in the same column SP are connected to one another by a conductor path on the bottom side of the circuit board (FIG. 2c), with each column of the circuit board having the corresponding interrogation line Z connected at the underside of the board.

When the diodes are arranged horizontally, programming of the diode matrix is effected by simply cutting away the unrequired diodes, utilizing a pair of side cutters. This procedure is equivalent in outlay to the procedure of breaking away the combs in previous mechanical code generators. In the event of an error, a substitute diode can readily be soldered into position or the circuit board exchanged.

A smaller size may be achieved by arranging the diodes vertically with respect to the circuit board in which case an additional synthetic i.e. plastic component may be provided for the positioning of the diodes. Automatic assembly of the circuit board and soldering in and removal in the event of any errors is more difficult, however, than in the use of a horizontal arrangement of the diodes. In this case the matrix is programmed merely by severing the free upper terminals of the unrequired diodes.

Having thus described our invention it will be obvious that although various minor modifications might be suggested by those versed in the art, it should be understood that we wish to embody within the scope of the patent granted hereon all such modifications as reasonably, and properly come within the scope of our contribution to the art.

We claim as our invention:

1. A method of producing a diode matrix composed of a plurality of diode components, carried by a plug-in circuit board, and adapted in use to be operatively disposed at selected matrix points forming a predetermined pattern in accordance with the desired matrix programming thereof, for character generators, in particular for the code generator of electronic teleprinters or for a circuit board with optionally differing line configurations, comprising the steps of disposing an individually formed diode, having respective individual lead elements, at each matrix point and connecting the individual diode lead elements to the circuit board to provide an operable diode for each possible operative matrix point of the total design number thereof, with such lead elements providing both the operative electrical and supporting connections between the associated diodes and the circuit board, thereby forming a complete electrically operative diode matrix having a total number of operative diodes in excess to the number of diodes to be operative, in use, in accordance with the desired program, with each diode being so disposed with respect to such board that a portion of at least one of the electrical lead elements connected thereto extending between such diode and the board is sufficiently exposed for possible severance thereat, and programming said matrix in accordance with the desired programming by determining each matrix point, of the total number thereof, at which the diode thereat is to be operative, and rendering all of said excess diodes inoperative by cutting the exposed portion of at least said one exposed lead element of each of said unrequired diodes.

2. A method according to claim 1, comprising the additional step of providing conductor paths on both sides of the circuit board.

3. A method according to claim 1, comprising the additional step of disposing the diodes in parallel relation with respect to the circuit board, whereby if desired both of the diode lead elements may be severed and the diode removed from the board.

4. A method according to claim 1, comprising the additional step of disposing the respective diodes at right angles to the circuit board whereby at least the outermost diode lead element is sufficiently exposed for severance.

* * * * *